US007619897B2

United States Patent
Della Fiora et al.

(10) Patent No.: US 7,619,897 B2
(45) Date of Patent: Nov. 17, 2009

(54) USER INTERFACE MODULE FOR A SERVER CHASSIS

(75) Inventors: Troy A. Della Fiora, Spring, TX (US); Scott Stephenson, Manvel, TX (US); Belgie B. McClelland, Houston, TX (US); Joseph R. Allen, Houston, TX (US); Eric Mei, Houston, TX (US); David W. Sherrod, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 336 days.

(21) Appl. No.: 11/590,127

(22) Filed: Oct. 31, 2006

(65) Prior Publication Data

US 2008/0100992 A1    May 1, 2008

(51) Int. Cl.
*H05K 5/00*    (2006.01)
(52) U.S. Cl. .................................. 361/724; 361/727
(58) Field of Classification Search .................. 361/724, 361/601, 725–727, 679–683; 710/301; 312/223.1, 312/223.2
See application file for complete search history.

(56) References Cited

U.S. PATENT DOCUMENTS

| 2,857,558 | A | * | 10/1958 | Fiske | 361/727 |
| 5,046,172 | A | * | 9/1991 | Moreux et al. | 361/601 |
| 5,877,938 | A | * | 3/1999 | Hobbs et al. | 361/724 |
| 6,330,161 | B1 | * | 12/2001 | Smith et al. | 361/724 |
| 6,535,391 | B2 | * | 3/2003 | Larsen et al. | 361/727 |
| 7,423,870 | B2 | * | 9/2008 | Carlisi et al. | 361/686 |
| 7,436,674 | B2 | * | 10/2008 | Barsun et al. | 361/727 |

FOREIGN PATENT DOCUMENTS

GB    2072954    * 10/1981

* cited by examiner

*Primary Examiner*—Michael C Zarroli (57) ABSTRACT

A device that may include a server chassis and a user interface module moveably coupled to the server chassis. In some embodiments, the user interface module is configured to move to a first position that allows access to a first server component and to a second position that allows access to a second server component that is different from the first server component.

20 Claims, 6 Drawing Sheets

USER INTERFACE MODULE FOR A SERVER CHASSIS

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Computing devices often include a user interface module, such as an input device, a display, or a combination thereof. For example, some rack servers include a user interface module that is affixed to the rack server. Typically, the user interface module is used to configure software on the rack server and address software errors. Affixing the user interface module to the rack server facilitates use and maintenance of the rack server by keeping the user interface module proximate to the rack server.

Unfortunately, user interface modules on conventional rack servers can impede performance. For instance, user interface modules are often damaged when installing a server blade into a rack server. Some server blades weigh 15 to 20 pounds and could fracture a user interface module if inadvertently impacted with the user interface module during installation. Additionally, in conventional rack servers, the user interface module consumes valuable space on the front of the rack server. By occupying this space the user interface module may impede access and airflow to components located behind the user interface module.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Certain embodiments of the present technique may address one or more of the problems with conventional rack servers discussed above. For example, some embodiments may include a protective member that shields the user interface module and reduces the likelihood of the user interface module being damaged. Additionally, some embodiments may include a user interface module that is movably attached to the rack server. The movable user interface module may facilitate access to components behind the user interface module by moving from a first position in front of the components to a second position that is not in front of the components.

Figure 1:
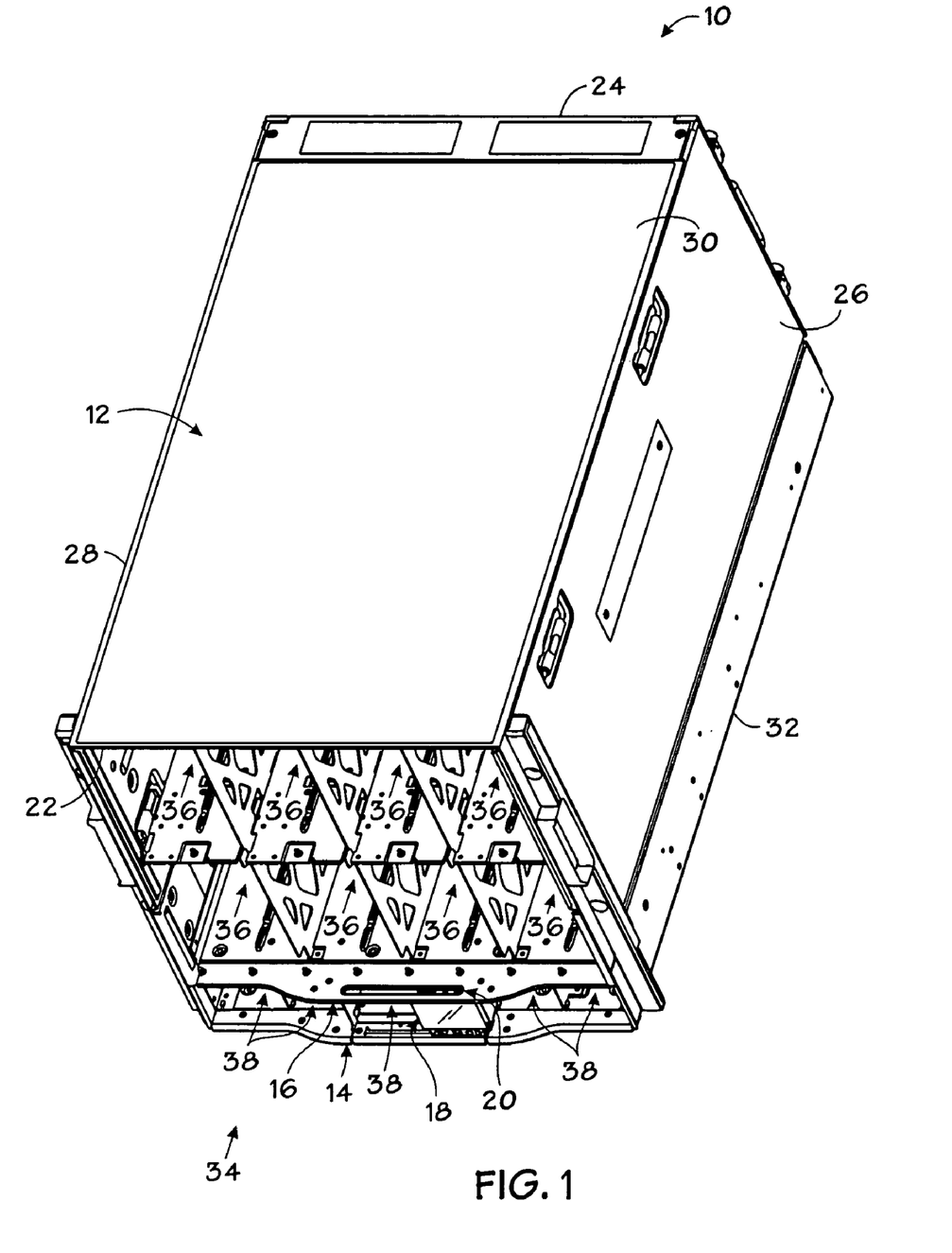
FIG. 1 is a perspective view of an exemplary rack server enclosure, in accordance with embodiments of the present technique.

FIG. 1 illustrates an exemplary rack server system 10. In the present embodiment, the rack server system 10 may include a rack server enclosure 12 (e.g., a server chassis) having a protective members 14 and 16 and a user interface module 18 movably coupled to the rack server enclosure 12 by an articulating coupling 20. As explained below, the protective members 14 and 16 may tend to protect or shield the user interface module 18, and the articulating coupling 20 may be used to move the user interface module 18 out of the way when accessing components behind the user interface module 18.

Figure 5:
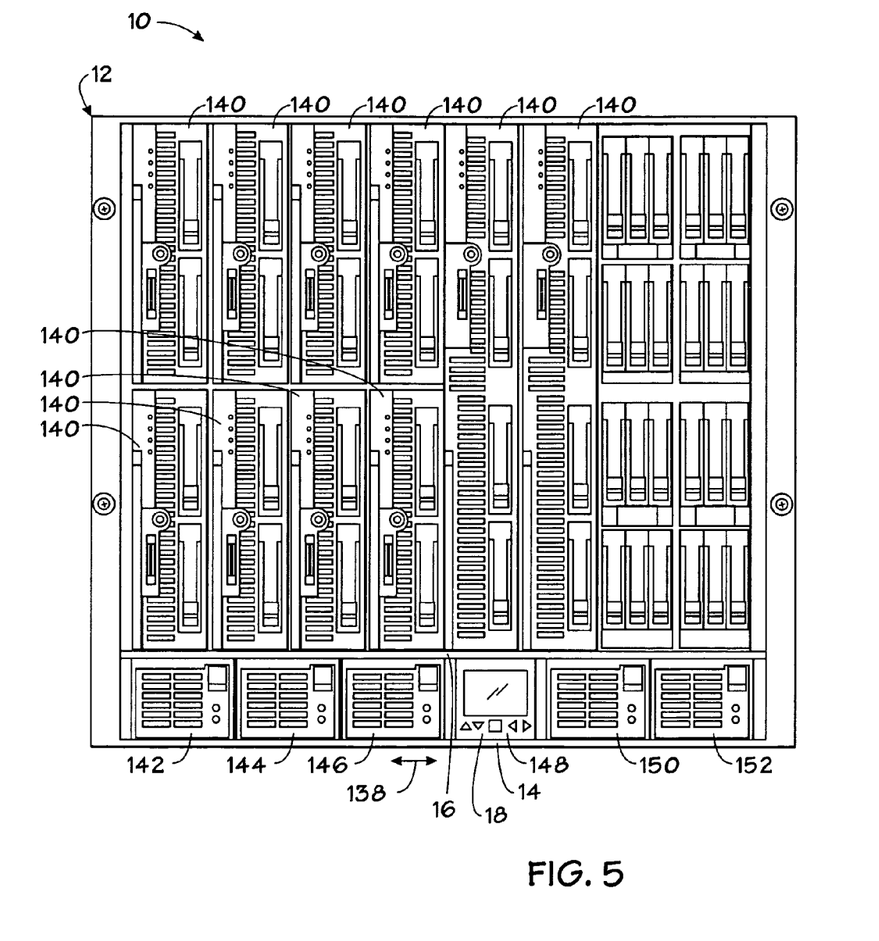
FIG. 5 is a front view of the exemplary rack server with the user interface module in a first position, in accordance with embodiments of the present technique.
Figure 6:
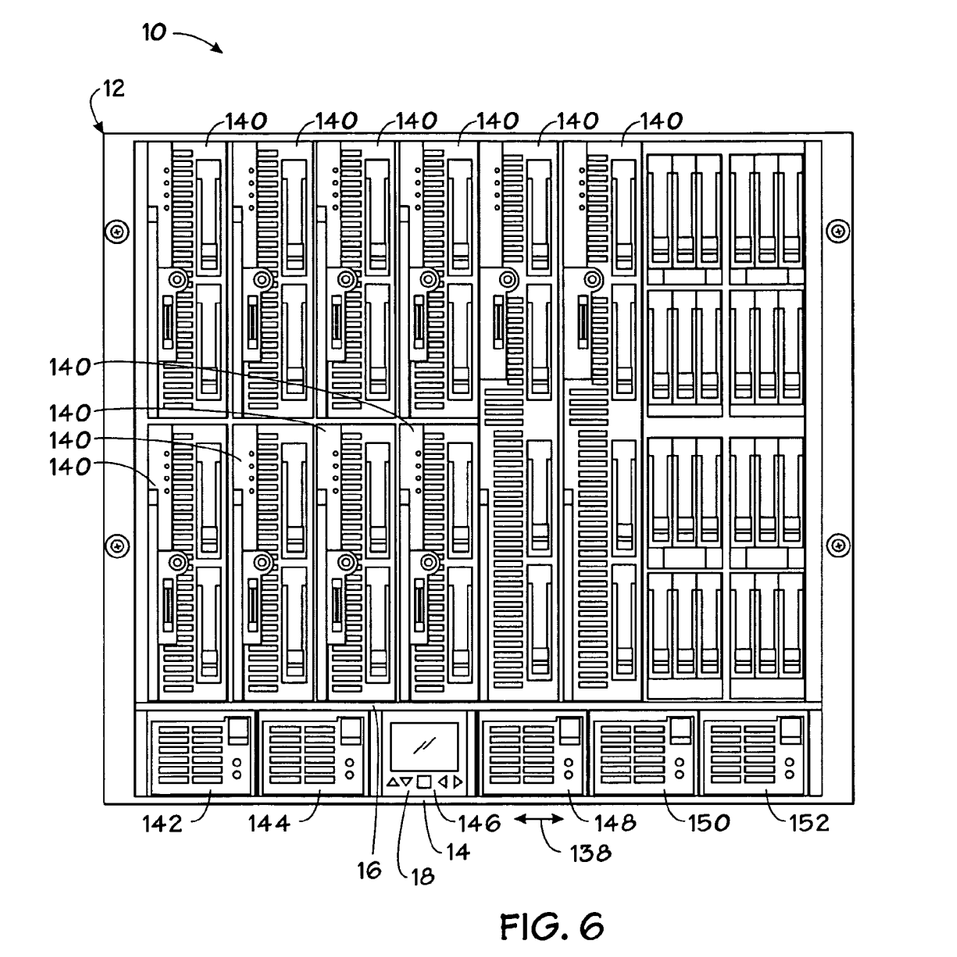
FIG. 6 is a front view of the exemplary rack server with the user interface module in a second position, in accordance with embodiments of the present technique.

The illustrated rack server system 10 may include a variety of types of computing devices, such as a workstation, a mainframe, a server tower, and/or one or more servers, such as blade servers (see FIGS. 5 and 6). The rack server system 10 may be employed in a variety of applications, e.g., as an application server, as a communications server, as a database server, as a fax server, as a file server, as a game server, as a Web server, and/or in a peer-to-peer capacity. The rack server system 10 may be modular and configured to be stacked adjacent similar rack server systems 10, for example, one over another on a rack. In some embodiments, a plurality of rack server systems 10 may be placed in a server room, such as a clean room having laminar airflow, fire suppression systems, and/or temperature control systems. It should also be noted that the present technique is not limited to rack server systems. For instance, embodiments may include a personal computer or a server tower.

The illustrated rack server enclosure 12 generally defines a rectangular parallelepiped (i.e., cuboid) volume and has a front 22, a back 24, sides 26 and 28, a top 30, and a bottom 32. The rack server enclosure 12 may be configured to conduct airflow 34 from the front 22 to the back 24, or vice versa. To this end, the back 24 of the rack server enclosure 12 may include a matrix of fans. The exterior surface of the rack server enclosure 12 may be made of an electromagnetic interference shielding material, such as sheet-metal or other conductive material. The interior of the rack server enclosure 12 may include an array or matrix of server receptacles 36 and one or more power supply receptacles 38. The receptacles 36 and 38 may be generally defined by side walls that extend through the rack server enclosure 12 in a direction that is generally parallel to the airflow 34 to facilitate front-to-back (or back-to-front) airflow 34. The receptacles 36 and 38 may include interfaces configured to secure various server components, such as blade servers and/or power supplies.

Figure 2:
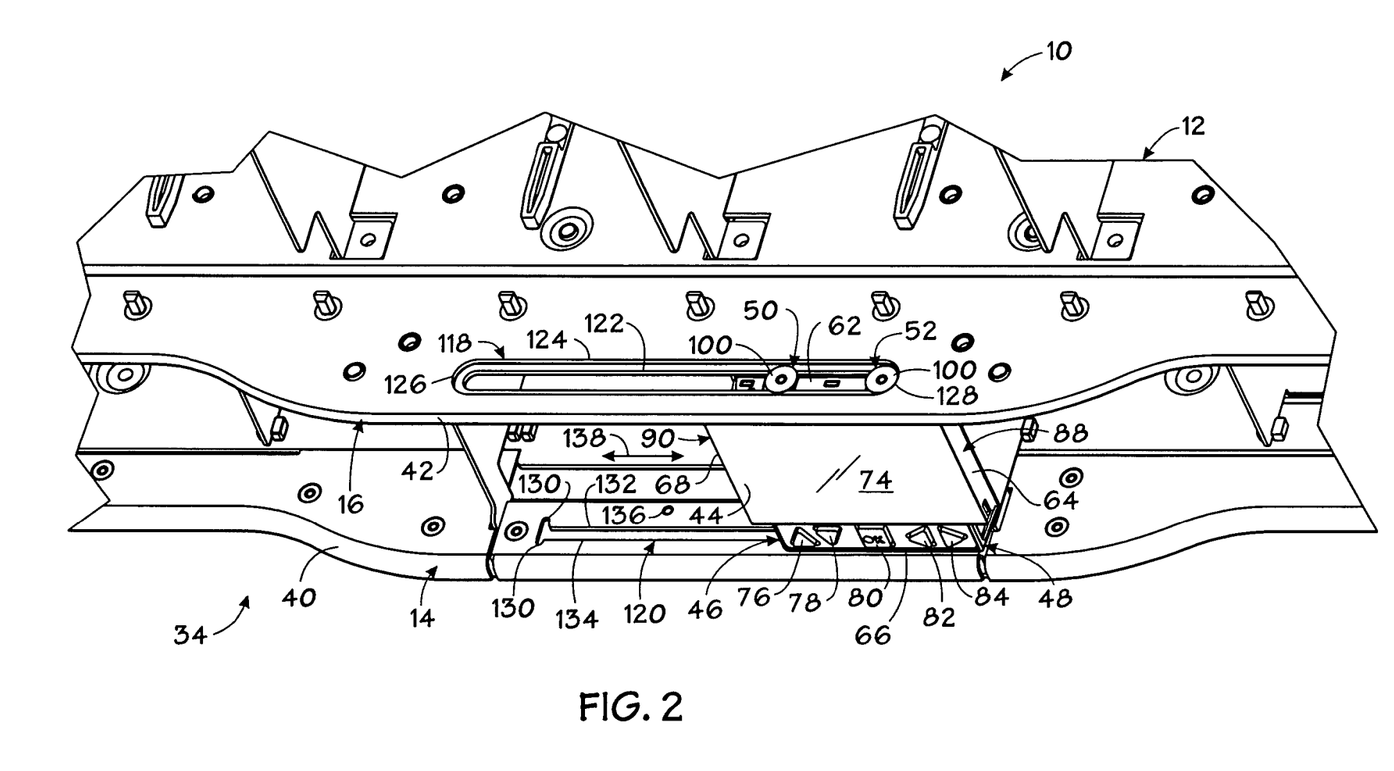
FIG. 2 is a partial perspective view of the exemplary rack server of FIG. 1 illustrating a user interface module, in accordance with embodiments of the present technique.

With reference to FIGS. 1 and 2, the protective members 14 and 16 will now be described. The protective members 14 and 16 may be disposed on the front 22 of the rack server enclosure 12. The protective members 14 and 16 may be made of sheet metal, plastic, composite, steel, aluminum, or other appropriate materials. In the present embodiment, the protective members 14 and 16 are, in part, integrally formed from an extended portion of the sheet-metal that forms part of the rack server enclosure 12. The illustrated protective member 14 also includes one or more plastic cover plates secured to the extended portion of the sheet-metal. The plastic cover plates may cover one or both of the protective members 14 and 16, and may hide mechanical components and wiring. The plastic cove plates may be secured by screws or other devices to the protective members, or they may form the protective members.

When viewed from the top 30, the protective members 14 and 16 have generally the same shape and extend from the rack server enclosure 12 with a curve-linear or S-shape at each end. In the present embodiment, the protective members 14 and 16 extended further to the front 22 of the rack server enclosure 12 than other portions of the rack server enclosure 12 and the user interface module 18. Thus, the user interface module 18 may be recessed relative to the protective member 14 and 16. In the present embodiment, the protective members 14 and 16 are generally symmetric about a plane through the middle of the rack server enclosure 12 that is parallel to the sides 26 and 28. Together, the protective members 14 and 16 may be described as a protective cage or roll bar-like structure.

The upper protective member 16 may be disposed generally below the portion of the rack server enclosure 12 that includes the server receptacles 36 and generally above the portion of the rack server enclosure 12 that includes the power supply receptacles 38. The lower protective member 14 may be disposed near the bottom 32 of the rack server enclosure 12, which is generally below the portion of the rack server enclosure 12 that includes the power supply receptacles 38. The illustrated protective members 14 and 16 may generally lie in a plane that is parallel with the top 30, the bottom 32, and airflow 34. One or more forward edges 40 and 42 of the protective members 14 and 16, respectively, may be rounded to avoid concentrating stress in the protective members 14 and/or 16 during an impact.

Advantageously, the protective members 14 and 16 may be configured to protect the user interface module 18 during a variety of activities, such as when servers are installed in the server receptacles 36, when power supplies are installed in the power supply receptacles 38, and/or when a rack door is closed. The protective members 14 and/or 16 may obstruct, or absorb kinetic energy from, objects moving toward the user interface module 18. Further, the generally planar aspect of the illustrated protective members 14 and 16 may facilitate movement of airflow 34 from the front 22 to the back 24 of the rack server enclosure 12 and limit the degree to which the protective members 14 and 16 impede access to server components.

Other embodiments may include other types of protective members 14 and 16. For instance, some embodiments may employ a single protective member 14 or 16 or additional protective members. In some embodiments, the protective members 14 and/or 16 may extend over substantially all or a portion of the user interface module and/or may include hinged joints, articulating members, movable portions, or removable portions to facilitate access to the user interface module 18. For instance, the protective members 14 and/or 16 may include a plastic or glass plate that selectively covers the user interface module 18. Alternatively, one or more bars or a grid may extend between the protective members 14 and 16. In some embodiments, the protective members 14 and/or 16 may be affixed or coupled directly to the user interface module 18 or other portion of the rack server system 10. Additionally, in some embodiments, the protective members 14 and/or 16 may extend in one or more other (non-horizontal) directions, such as generally vertically, in planes that are parallel to the sides 26 and 28. It should also be noted that in some embodiments the protective members 14 and/or 16 do not extend outward relative to the rack server enclosure 12, e.g., the user interface module 18 may be recessed further into the rack server enclosure 12 and the protective members 14 and/or 16 may be generally co-planar with the front 22 of the rack server enclosure 12.

Figure 3:
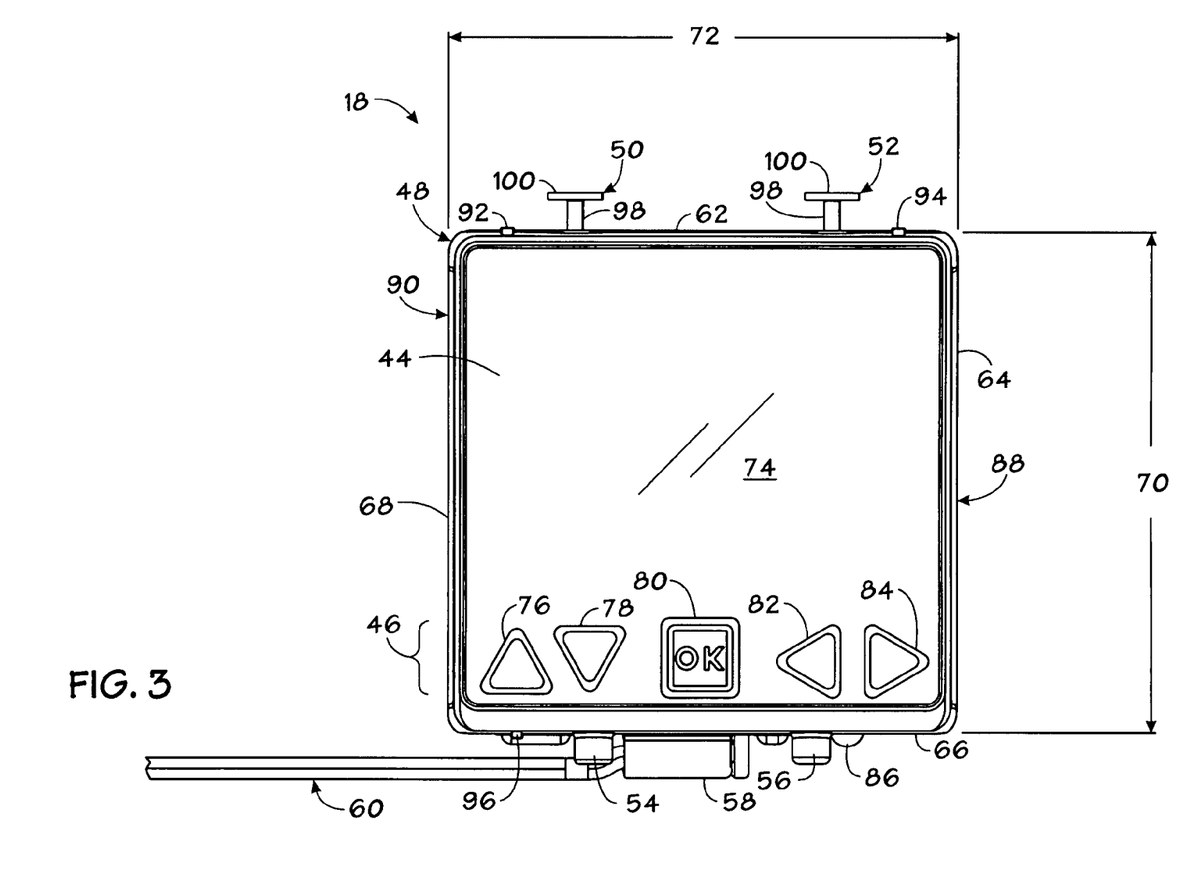
FIG. 3 is a front view of the user interface module, in accordance with embodiments of the present technique.

With reference to FIGS. 2 and 3, the user interface module 18 will now be described. The user interface module 18 may include a display 44, a user input device 46, a housing 48, upper guide members 50 and 52, lower guide members 54 and 56, a cable interface 58, and a cable 60. The illustrated user interface module 18 has a generally rectangular parallelepiped shape with rounded corners and a top edge 62, a right edge 64, a bottom edge 66, and a left edge 68. The user interface module 18 may have a height 70 and/or width 72 sized such that it may be grasped in a typical user's hand, for example between a user's thumb and forefinger. In some embodiments, the height 70 and/or width 72 may be less than 8 inches, 7 inches, 6 inches, 5 inches, 4 inches, 3 inches, or less. Advantageously, sizing the user interface module 18 such that a user may grasp it in one hand may facilitate manipulation of the position of the user interface module 18, as described below. The user interface module 18 may have a thickness (i.e., the dimension orthogonal to both the width 72 and the height 70) configured to be grasped between a user's forefinger and thumb to facilitate manipulation of the user interface module 18, e.g., a thickness less than 1 inch.

The display 44 may include a variety of devices configured to convey information to a user, such as a visual display, an audio indicator (e.g., a speaker), and/or a tactile indicator (e.g., a haptic device). In some embodiments, the display 44 may include a liquid crystal display (e.g., an active matrix thin film transistor liquid crystal display), an organic light emitting diode display, a plasma display, a surface conduction electron emitter display, a flat-panel display, a cathode ray tube display, and/or an electronic ink display, among others. The display 44 may be backlit, emissive, and/or reflective. The display 44 may generally define or be positioned behind a front face 74 of the user interface module 18. In some embodiments, a clear or generally translucent material, such as Lexan or glass, may cover all or part of the display 44.

The illustrated user input device 46 has several buttons, including an up button 76, a down button 78, and enter button 80, a left button 82, and a right button 84. In other embodiments, the user input device 46 may include more or fewer buttons, other arrangements of buttons, or other types of input devices. For instance, the user input device 46 may include a microphone configured to transmit an audio signal to a processor running a speech recognition algorithm and/or an imaging device configured to transmit an image signal to a processor running an image recognition algorithm. Alternatively, or additionally, the user input device 46 may include a digitizer (such as one disposed behind the display 44), a touchpad, a touch screen, a mouse, a trackball, a keyboard, and/or a biometric security device.

In the present embodiment, the user input device 46 and display 44 are integrated into the housing 48 of the user interface module 18. That is, the user input device 46 and display 44 share the housing 48. In other embodiments, the user input device 46 and display 44 may be removably attached to one another and/or separate devices.

The housing 48 may include a resilient cam 86, side grips 88 and 90, and spacers 92, 94, and 96. The resilient cam 86 may include a generally hemispherical member that is biased downward by a resilient structure, such as a spring that is compressed against the housing 48. As explained below, the resilient cam 86 may cooperate with other components to provide tactile feedback and indicative of the position of the user interface module 18. The side grips 88 and 90 may include a rubberized inserts, textured surfaces, and/or indentations to facilitate movement of the user interface module 18.

In the present embodiment, the upper guide members 50 and 52 may include a shaft 98 and a head 100. The shafts 98 may extend generally perpendicularly from the top edge 62 of the user interface module 18. The shafts 98 may generally have the shape of a right cylindrical volume with a circular base. Similarly, the heads 100 may extend generally in parallel with the shafts 98 from the tops of the shafts 98 and generally have the shape of a right cylindrical volume with a circular base. The heads 100 may be centered on the shafts 98 and the head 100 may be enlarged relative to shaft 98, e.g., the head 100 may have a diameter that is larger than a diameter of the shafts 98. The upper guide members 50 and 52 may be generally symmetrically disposed along the top edge 62 of the user interface module 18.

The lower guide members 54 and 56 of the illustrated embodiment may extend generally perpendicularly from the lower edge 66 of the user interface module 18. The lower guide members 54 and 56 may generally have the shape of a right cylindrical volume with a circular base. In the present embodiment, the lower guide members 54 and 56 are generally symmetrically dispose along the bottom edge 66 of the user interface module 18.

Figure 4:
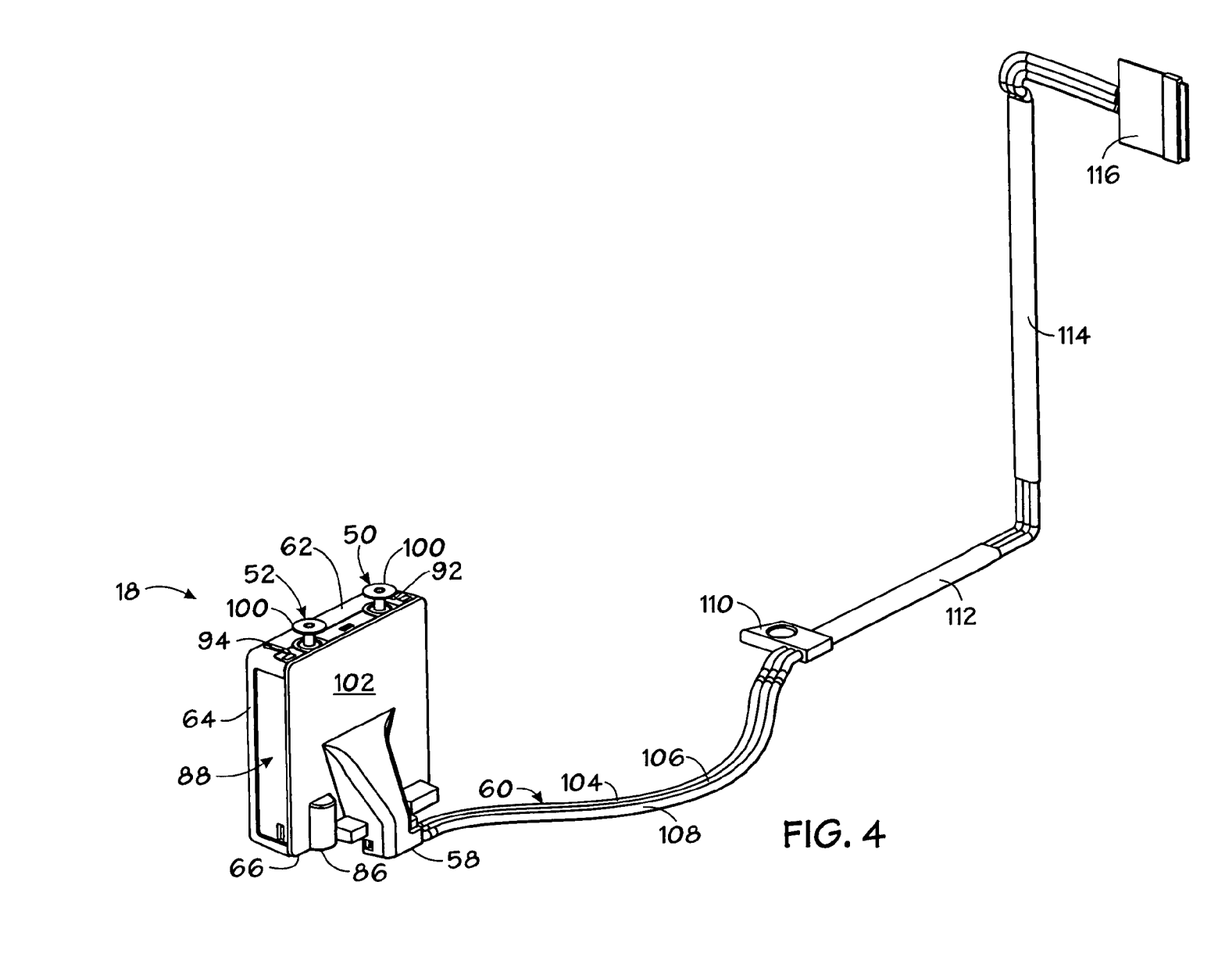
FIG. 4 is a rear perspective view of the user interface module, in accordance with embodiments of the present technique.

The cable interface 58 and cable 60 are illustrated by the rear perspective view of FIG. 4. In the present embodiment, the cable interface 58 extends from a rear face 102 of the user interface module 18 and couples to the cable 60. A portion of the cable interface 58 may extend below the bottom edge 66 of the user interface module 18, where it connects to cable 60, to position the cable 60 below various subsequently discussed components. The cable 60 may extend from the cable interface 58 in a direction that is generally parallel to a direction in which the user interface module 18 is configured to move, as explained further below.

The cable 60 may include sub cables 104, 106, and 108; a mounting bracket 110; conduit 112 and 114; and a midplane interface 116. The sub cables 104, 106, and 108 may be positioned adjacent one another and generally lying in a plane that is adjacent to and parallel to the bottom 32 of the rack server enclosure 12. The sub cables 104, 106, and 108, in some embodiments, are not bonded or coupled to one another along part, or substantially all, of their length between the cable interface 58 and the mounting bracket 110. That is, in some embodiments, the sub cables 104, 106, and 108 are generally free to slide against one another as the user interface module 18 articulates. This sliding motion may facilitate movement of the user interface module 18 while reducing stress on the sub cables 104, 106, and 108 and while reducing the amount of space occupied by the sub cables 104, 106, and 108 as the user interface module 18 moves. In some embodiments, the sub cables 104, 106, and 108 may be sandwiched between layers of sheet metal to protect the cables and generally confine them to a plane so that they do not interfere with airflow 34. The mounting bracket 110 may couple the sub cables 104, 106, and 108 to one another and to a rack server enclosure 12. Conduit 112 and 114 may confine and protect sub cables 104, 106, and 108. The midplane interface 116 may be configured to communicatively couple to user interface module 18 to a midplane of the rack server system 10. Alternatively, or additionally, the midplane interface 116 may be configured to connect to a backplane or interface card among other devices. The signals carried by the sub cables 104, 106, and 108 may couple to control logic on the midplane or may be routed to another connector on the midplane that connects to a module or pc board with control logic for the user interface module.

In operation, the user interface module 18 may be used to interact with the rack server system 10. For instance, installation, error recovery, and configuration parameters may be viewed on the display 44 and selected or adjusted through the user interface 46. To this end, the rack server system 10 may include enclosure management software for controlling the operation of servers. The enclosure management software may be configured to receive commands from the user interface module 18 and/or display information on the user interface module 18.

Returning to FIG. 2, aspects of the exemplary articulating coupling 20 will now be described. In the present embodiment, the articulating coupling 20 may include the upper guide members 50 and 52, the lower guide members 54 and 56, an upper slot 118, and a lower slot 120. The upper slot 118 may be formed behind the upper protective member 16, and the lower slot 120 may be formed behind the lower protective member 14. In the present embodiment, both the upper slot 118 and the lower slot 120 are generally linear, generally parallel to each other, and generally parallel to the front 22 and back 24 of the rack server system 10.

The upper slot 118 may include an inner channel 122, an outer channel 124, and rounded ends 126 and 128. The outer channel 124 may define a volume that generally corresponds with the heads 100 (e.g., substantially the same diameter and thickness) of the guide members 50 and 52, and the inner channel 100 may define a volume that generally corresponds with the shafts 98 (e.g., substantially the same diameter) on the guide members 50 and 52. That is, the inner channel 122, in the present embodiment, is sized such that the shaft 98 may extend through the inner channel 122 but the head 100 may not. The upper slot 118 may be configured to receive the guide members 50 and 52 and permit the user interface module 18 to slide along the length of upper slot 118, as indicated by arrow 138.

The lower slot 120 may include stress relief structures 130, tapered portions 132 and 134, and detents 136. The stress relief structures 130 may be positioned at the ends of the lower slot 120 to reduce internal stresses that might otherwise arise in a corner having a smaller radius. One or more detents 110 (for example, 2, 3, 4, 5 or more) may be positioned along the length of the lower slot 98 to provide tactile feedback to a user about the position of the user interface module 18. The detents 110 may interface with the resilient cam 86 on the bottom edge 66 of the user interface module 18. The width of the lower slot 120 may generally correspond to the dimensions of the lower guide members 54 and 56 on the user interface module 18. That is, the lower slot 120 may be configured to receive the lower guide members 54 and 56 such that the lower guide members 54 and 56 may slide along the length of the lower slot 120, as indicated by arrow 138.

When assembled, the user interface module 18 may be slideably coupled to the rack server system 10 by the articulating coupling 20. The heads 100 of the guide members 50 and 52 may be positioned partly or entirely in the outer channel 124 of the upper slot 118, and the shafts 98 of the guide members 50 and 52 may extend through the inner channel 122 of the upper slot 118. Additionally, the lower guide members 54 and 58 may extend into the lower slot 120. That is, the articulating coupling 20 may moveably (e.g., slideably) couple the user interface module 18 to the rack server enclosure 12 such that the user interface module 18 generally has a single degree of freedom corresponding to the movement indicated by arrow 138.

Other embodiments may include other types of articulating couplings 20, including, but not limited to, rotating couplings, telescoping couplings, and couplings having two, three, four, or more degrees of freedom. For example, the user interface module 18 may be configured to both slide and pivot about an axis parallel to the direction of sliding 138 (e.g., it may pivot upward or downward to face a user). In another example, the user interface module 18 may be coupled to the rack server enclosure 12 by a boom arm (or four-bar or multi-bar linkage) having 1, 2, 3, 4, 5, 6 or more pivot points. In some embodiments, the user interface module 18 may be detachably coupled to the rack server enclosure 12, for instance by Velcro, locking paths, snaps, or other resilient devices, and/or configured to wirelessly communicate with the rack server system 10.

FIGS. 5 and 6 illustrate the rack server system 10 with blade servers 140 and power supplies 142, 144, 146, 148, 150, and 152 installed therein. These figures also illustrate movement 138 of the user interface module 18. Specifically, FIG. 5 depicts the exemplary rack server system 10 with the user interface module 18 in a first, rightmost position, and FIG. 6 depicts the rack server system 10 with the user interface module 18 in a second, leftmost position. Advantageously, the user interface module 18 may be accessible to a user (e.g., the display 44 is visible, and/or the user input device 46 is exposed) in the first position, the second position, and each intermediate position.

Additionally, by sliding from the first position (FIG. 5), which is in front of power supply 148, to the second position, which is in front of power supply 146, the user interface module 18 may facilitate access to the power supply 148. That is, a user may slide the user interface module 18 out of the way when accessing a component that would otherwise be behind the user interface module 18. In other words, the user interface module 18 is configured to enable access to components of the rack server system by translating between various positions on the front 22 of the rack server system 10.

In the present embodiment, the protective members 14 and 16 may protect the user interface module 18 in the first position, the second position, and each intermediate position. That is, throughout all or a substantial part of the range of motion of the user interface module 18, the protective members 14 and 16 are disposed both further from the rack server system 10 than the front face 74 of the user interface module 18 and adjacent or near the front face 74. In other words, the protective members 14 and 16 are configured to protect the user interface module 18 through all or a substantial portion of its range of motion.

What is claimed is:

1. A device comprising:
   a server chassis;
   a user interface module moveably coupled to the server chassis, wherein the user interface module is configured to move to a first position that enables access to a first server component and to a second position that enables access to a second server component that is different from the first server component; and
   the user interface module comprises a display that is viewable in both the first position and the second position.

2. The device of claim 1, wherein the user interface module is slideably coupled to the server chassis.

3. The device of claim 1, wherein the server chassis comprises a slot and the user interface module comprises a guide member at least partially disposed in the slot.

4. The device of claim 1, wherein the user interface module has a single degree of freedom relative to the server chassis.

5. The device of claim 1, wherein the server chassis comprises one or more blade servers, one or more power supplies, or a combination thereof.

6. The device of claim 1, wherein the user interface module is accessible in both the first position and the second position, and wherein the second position is at least partially in front of the first server component.

7. A device comprising:
   a server chassis;
   a user interface module moveably coupled to the server chassis, wherein the user interface module is configured to move to a first position that enables access to a first server component and to a second position that enables access to a second server component that is different from the first server component; and
   the user interface module comprises a display and user input integrated into a housing, and wherein the user interface module is configured to move parallel to a front face of the server chassis.

8. A device comprising:
   a user interface module that comprises a display and user input device; and
   a server enclosure coupled to the user interface module; and
   a first protective member integrally formed with the server enclosure, the first protective member is proximate to the user interface module, and wherein at least part of the first protective member is disposed further from the server enclosure than a front face of the user interface module.

9. A device comprising:
   a user interface module; and
   a server enclosure coupled to the user interface module;
   a first protective member that is proximate to the user interface module, wherein at least part of the first protective member is disposed further from the server enclosure than a front face of the user interface module; and
   a second protective member that is proximate to the user interface module and that is disposed on an opposite side of the user interface module relative to the first protective member, wherein at least part of the second protective member is disposed further from the server enclosure than the front face of the user interface module.

10. The device of claim 9, wherein the first protective member is integrally formed, at least in part, from a protruding portion of the server enclosure.

11. The device of claim 9, wherein the first protective member is affixed to the user interface module.

12. The device of claim 9, wherein the user interface module is coupled to the server enclosure by an articulating coupling.

13. The device of claim 12, wherein at least part of the first protective member is disposed adjacent the user interface module and further from the server enclosure than the front face of the user interface module throughout substantially all of a range of motion of the user interface module.

14. A device comprising:
   a server chassis;
   a user interface module configured to slide in a direction that is parallel to a front face of the server chassis from a first position to a second position, wherein the second position is substantially different from the first position and the user interface module is accessible in both the first position and the second position; and a protective member that is proximate to the user interface module.

15. The device of claim 14, wherein the user interface module is disposed at least partially in front of a server component in the first position and not disposed in front of the server component in the second position.

16. The device of claim 15, wherein the server component is a power supply.

17. The device of claim 14, comprising:
a midplane; and
a cable coupled to both the user interface module and the midplane, wherein the cable comprises two or more sub-cables disposed adjacent one another and configured to side against one another.

18. A device comprising:
a server chassis;
a user interface module coupled to a front of the server chassis by an articulating coupling having two or fewer degrees of freedom, the user interface module configured to move from a first position to a second position relative to the server chassis, wherein the second position is substantially different from the first position and the user interface module is accessible in both the first position and the second position;
a protective member that is proximate to the user interface module; and
the user interface module comprises a display that is visible in the first position, the second position, and there between.

19. The device of claim 18, wherein the user interface module is disposed at least partially in front of a server component in the first position and not disposed in front of the server component in the second position.

20. The device of claim 18, comprising:
a midplane; and
a cable coupled to both the user interface module and the midplane, wherein the cable comprises two or more sub-cables disposed adjacent one another and configured to side against one another.

* * * * *